United States Patent
Paulin

(10) Patent No.: US 10,243,522 B2
(45) Date of Patent: Mar. 26, 2019

(54) FULLY INTEGRATED LOW-NOISE AMPLIFIER

(71) Applicant: STMicroelectronics SA, Montrouge (FR)

(72) Inventor: Raphael Paulin, Le Versoud (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/833,039

(22) Filed: Dec. 6, 2017

(65) Prior Publication Data

US 2018/0097481 A1 Apr. 5, 2018

Related U.S. Application Data

(63) Continuation of application No. 15/229,464, filed on Aug. 5, 2016, now abandoned.

(30) Foreign Application Priority Data

Feb. 4, 2016 (FR) ...................................... 16 50888

(51) Int. Cl.
| | |
|---|---|
| *H03F 1/56* | (2006.01) |
| *H03F 3/195* | (2006.01) |
| *H03F 1/22* | (2006.01) |
| *H04B 5/00* | (2006.01) |
| *H03F 1/08* | (2006.01) |

(52) U.S. Cl.
CPC ............ *H03F 1/565* (2013.01); *H03F 1/086* (2013.01); *H03F 1/223* (2013.01); *H03F 3/195* (2013.01); *H04B 5/0081* (2013.01); *H03F 2200/108* (2013.01); *H03F 2200/181* (2013.01); *H03F 2200/216* (2013.01); *H03F 2200/294* (2013.01); *H03F 2200/297* (2013.01); *H03F 2200/301* (2013.01); *H03F 2200/321* (2013.01); *H03F 2200/336* (2013.01); *H03F 2200/387* (2013.01); *H03F 2200/391* (2013.01); *H03F 2200/451* (2013.01); *H03F 2200/48* (2013.01); *H03F 2200/489* (2013.01); *H03F 2200/492* (2013.01); *H03F 2200/75* (2013.01)

(58) Field of Classification Search
USPC ................. 330/307, 311, 283, 277, 188, 195
See application file for complete search history.

(56) References Cited

U.S. PATENT DOCUMENTS

| | | |
|---|---|---|
| 8,912,845 B2 | 12/2014 | Jordan |
| 2006/0181386 A1 | 8/2006 | Lee et al. |

(Continued)

OTHER PUBLICATIONS

INPI Search Report and Written Opinion for FR 1650888 dated Sep. 8, 2016 (6 pages).

*Primary Examiner* — Hieu P Nguyen

(74) *Attorney, Agent, or Firm* — Crowe & Dunlevy

(57) ABSTRACT

A low-noise amplifier device includes an inductive input element, an amplifier circuit, an inductive output element and an inductive degeneration element. The amplifier device is formed in and on a semiconductor substrate. The semiconductor substrate supports metallization levels of a back end of line structure. The metal lines of the inductive input element, inductive output element and inductive degeneration element are formed within one or more of the metallization levels. The inductive input element has a spiral shape and the an amplifier circuit, an inductive output element and an inductive degeneration element are located within the spiral shape.

20 Claims, 2 Drawing Sheets

(56) References Cited

U.S. PATENT DOCUMENTS

| | | |
|---|---|---|
| 2008/0185679 A1 | 8/2008 | Hsu et al. |
| 2011/0128084 A1 | 6/2011 | Jin et al. |
| 2016/0164476 A1 | 6/2016 | Wang et al. |

FULLY INTEGRATED LOW-NOISE AMPLIFIER

CROSS REFERENCE TO RELATED APPLICATIONS

This application is a continuation of U.S. patent application Ser. No. 15/229,464 filed Aug. 5, 2016 (now abandoned), which claims priority to French Application for Patent No. 1650888 filed Feb. 4, 2016, the disclosures of which are incorporated by reference.

TECHNICAL FIELD

The invention relates to low-noise amplifiers, in particular those used in wireless telecommunications systems and more specifically for mobile telephony.

BACKGROUND

In a system for transmitting/receiving radiofrequency signals, the receiving stage comprises an antenna allowing for the reception of a signal that will be transmitted to an amplifier circuit. Elements such as filters may be inserted between the antenna and the amplifier circuit. The main purpose of the amplifier is to bring the signal to a level suitable for the demodulation circuit.

In the case of receivers for wireless telecommunications infrastructure, there is a great need to amplify the received signal with very low noise and high linearity.

Low-noise amplifiers (LNAs) simultaneously demand a relatively high gain depending on the standard used, low noise, good input and output matching and solid stability with regard to the operating current.

Usually, low-noise amplifiers are equipped with an amplifier circuit generally comprising active elements such as transistors, with an inductive degeneration element, with an inductive output element and, additionally, an inductive element for matching the input impedance (or inductive input element). The inductive input element allows, to the first order, the imaginary part of the input impedance of the amplifier to be cancelled out, in order to have an input impedance corresponding to the impedance of the system connected to the input (generally 50 ohms for an antenna) at the operating frequency of the amplifier. This allows an optimal transfer of energy.

In order to minimize the noise at frequencies of the order of a GHz, the inductive input element advantageously has a quality factor "Q" that is the highest possible. An increase in the surface area of the inductive element, with respect to a more compact inductive element of the same inductance, makes it possible to increase the quality factor "Q". It is for this reason that usually, for demanding noise specifications, the inductive input element is not integrated on the same, for example silicon, substrate as the amplifier circuit, owing to the large potential size thereof.

The inductive input element is consequently usually positioned on the outside of the integrated amplifier circuit, for example on a printed circuit board. These external inductive elements, also called discrete elements, have a high quality factor "Q".

Currently, in particular within the framework of the Long-Term Evolution (LTE) telecommunications standards, the specifications for a low-noise amplifier in a frequency band of 2.62 GHz to 2.69 GHz are, for example, a gain of about 13 dB, a noise factor (NF) of about 1 dB, a third-order input interception point (IIP3) of about 5 dBm and an isolation $S_{12}$ of about −20 dB.

The isolation parameter $S_{12}$ represents the way in which a variation applied to the output of a system is felt at the input thereof, and vice versa. It is then possible to speak of the robustness of the amplification system. The IIP3 parameter is representative of the linearity of the amplification.

SUMMARY

According to one embodiment, an LNA device is proposed which has specifications in accordance with the LTE standards and which is completely incorporated into an integrated circuit, having no need of a connected inductive input-matching element outside the integrated circuit (also called a discrete element).

The proposed device consequently makes it possible, for example, to decrease the size of the total amplifier circuit, corresponding to the discrete element and the integrated amplifier circuit in the usual case, and in particular also advantageously makes it possible to easily incorporate and use the device, for example in a wireless telecommunication system.

The proposed amplifier device is obtained by advantageously producing, on one and the same semiconductor substrate equipped with a back end of line (BEOL) portion, the active amplifier circuit and the inductive input element, the amplifier circuit being positioned on the inside of the coil of the inductive input element.

Consequently, the proposed device occupies a surface area that is substantially unchanged with respect to a conventional amplifier circuit, which additionally requires a discrete element.

Thus, according to one aspect, an integrated amplifier device, advantageously of the low-noise type, is proposed comprising an inductive input element, an amplifier circuit, an inductive output element and an inductive degeneration element, the amplifier circuit and said inductive output and degeneration elements being located on the inside of said inductive input element.

Thus, the inductive input element is included in the integrated low-noise amplifier circuit, for example on silicon, for a silicon surface area that is substantially unchanged with respect to a usual integrated amplifier circuit which requires an external inductive element at the input thereof. The size of the total amplifier system, i.e. including the inductive input element, is consequently notably reduced while meeting the same specifications.

According to one embodiment, the inductive input element is configured to permit an input current to flow between an input terminal and the amplifier circuit in a first direction, and the inductive output element is configured to permit an output current to flow between the amplifier circuit and a supply terminal in a second direction that is opposite to the first direction.

This makes it possible to decrease the magnetic coupling between the inductive input element and the inductive output element. Specifically, the magnetic fields generated on the inside of a coil generate a magnetic field that disrupts the surroundings, being able to modulate, through mutual induction, the inductance of neighboring inductive elements for example.

According to one embodiment, the amplifier circuit comprises at least one first transistor configured to be in amplification mode and may advantageously comprise a cascode assembly comprising the first transistor and a second transistor.

Cascode assemblies generally comprise two transistors in series and have the advantage of ensuring a good isolation parameter $S_{12}$, with little in the way of interactions between the output and the input. Furthermore, cascode assemblies generally have a good stability.

According to one embodiment, the inductive input element is coupled between the gate of the first transistor and an input terminal of said device, the gate of the first transistor being placed as close as possible to an end of the inductive input element, i.e., at the smallest distance permitted by the design rules of the technology in question.

Stated otherwise, the interconnection between the input terminal and the gate of the transistor is optimized so as to obtain the desired inductance "L" and a quality factor "Q" that is optimal at the working frequency. It is the entirety of this interconnection that is optimized, using an electromagnetic simulator, for example.

Such a configuration allows especially the noise performance of the device to be optimized by limiting input losses.

According to one embodiment, the inductive degeneration element is coupled between the source of the first transistor and a ground terminal, the source of the first transistor being placed as close as possible to one end of said inductive degeneration element and the ground terminal being placed as close as possible to another end of said inductive degeneration element, i.e., at the smallest distances permitted by the design rules of the technology in question.

Stated otherwise, the interconnection between the source of the first transistor and the ground terminal is optimized so as to obtain the desired inductance "L" and a quality factor "Q" that is optimal at the working frequency. It is the entirety of this interconnection that is also optimized, using an electromagnetic simulator for example.

In order to be subjected to a minimum of parasitic signals, said inductive input element may advantageously comprise a metal track in the form of a non-intersecting spiral. Indeed, intersecting metal tracks introduce restrictive parasitic components.

An integrated circuit is also proposed incorporating an amplifier device such as defined above.

BRIEF DESCRIPTION OF THE DRAWINGS

Other advantages and features of the invention will become apparent upon examining the detailed description of completely non-limiting embodiments, and the appended drawings in which.

DETAILED DESCRIPTION

Figure 1:
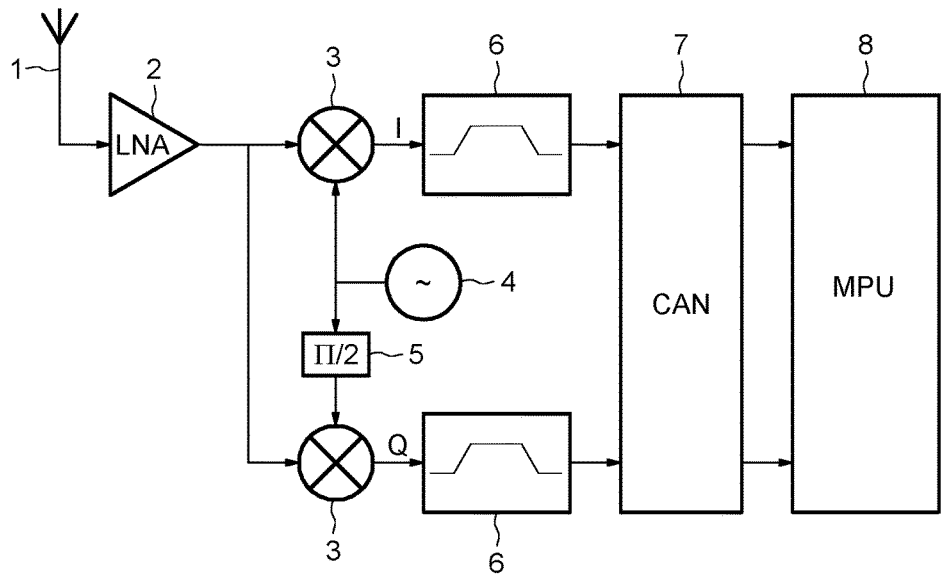
FIG. 1 shows an exemplary receiving stage of a telecommunication system.

FIG. 1 shows an exemplary conventional receiving stage, for example of a telecommunication system, comprising an antenna 1, directly coupled to a low-noise amplifier (LNA) 2.

The amplified signal output from the LNA is mixed by two mixers 3 with a local oscillator signal 4 and this local oscillator signal phase-shifted by 90° by a phase shifter 5, respectively.

At the output of the mixers 3, analog signals transposed onto the channel I and onto the channel in phase quadrature Q are obtained, which will subsequently be filtered by filters 6 and converted into digital signals by an analog-digital converter (CAN) 7, then processed, in particular demodulated, by a processing stage (MPU) 8.

Figure 2:
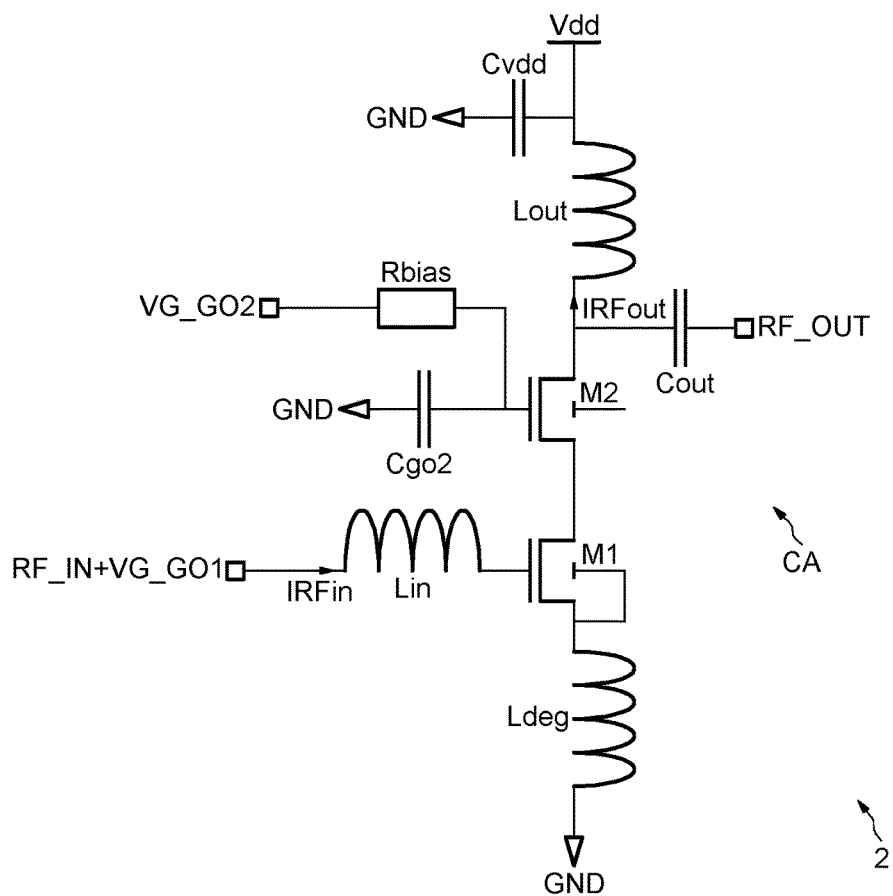
FIG. 2 shows an exemplary circuit diagram of an amplifier device.

FIG. 2 shows a circuit diagram of an, advantageously low noise, amplifier device, comprising an amplifier circuit CA and an inductive input element Lin, an inductive degeneration element Ldeg and an inductive output element Lout.

The amplifier circuit CA comprises active elements, such as transistors for example.

The amplifier device 2 conventionally comprises supply Vdd and ground GND terminals, an input terminal receiving signal RF_IN+VG_GO1, an output terminal generating signal RF_OUT, and a bias voltage terminal receiving bias voltage VG_GO2.

The amplifier circuit CA here comprises a cascode assembly of two transistors M1, M2 in series, the source of the transistor M2 being connected to the drain of the transistor M1, used in amplification mode. The amplification function could be ensured by a common-source assembly, for example, or any other assembly ensuring this function.

The source of the transistor M1 is connected to ground via the inductive degeneration element Ldeg.

One terminal of the inductive input element Lin is connected receiving the input receiving signal RF_IN+VG_GO1 and another terminal is connected at the gate of the transistor M1.

The gate of the transistor M2 is connected to a node linking a bias resistor Rbias connected to the bias voltage terminal receiving bias voltage VG_GO2 and a decoupling capacitor Cgo2 connected to the ground GND.

The drain of the transistor M2 is connected to an output node linking the output generating the signal RF_OUT of the amplifier 2 via an output capacitor Cout and a terminal of an inductive output element Lout which has a further terminal connected to the supply terminal Vdd. The supply terminal Vdd is directly connected to a decoupling capacitor Cvdd linked to ground GND.

Thus, the transistor M1 is controlled via the gate thereof by the input signal RF_IN+VG_GO1, said input signal comprising the signal to be amplified RF_IN transmitted by an antenna for example, and a bias voltage VG_GO1 biasing the transistor M1 to a given on-state corresponding to a desired power consumption.

The input signal RF_IN+VG_GO1 resistively generates an input current IRFin that flows through the inductive input element Lin.

The inductive degeneration element Ldeg allows the input impedance matching to be optimized in combination with the inductive input element Lin in particular. More specifically, to the first order, the inductive input element Lin allows the imaginary part of the input impedance of the LNA to be cancelled out and the inductive degeneration element Ldeg allows the real part of the input impedance to be set to 50 ohms, for a reference impedance of 50 ohms.

The resistance Rbias allows the gate of the transistor M2 to be biased while presenting a high impedance to the input radiofrequency signal. The capacitor Cgo2 allows the radiofrequency signal entering at the drain of the transistor M2 to see ground.

The transistor M2 is controlled by the bias voltage VG_GO2, which may be, for example, of 1.5 V so as to bias the drain of the transistor M1 to 1.2 V, in the case of a supply voltage Vdd at 2.5 V.

An output current IRFout, corresponding to the amplified input current IRFin, flows into the inductive output element Lout and into the output capacitor Cout.

The transistor M1 has been shown in body contact configuration, i.e. the source terminal and the substrate ("body") terminal of the transistor M1 are linked, ensuring good linearity of amplification. The transistor M2 has been shown in floating body configuration, i.e. the potential of the substrate ("body") thereof is floating, facilitating the architecture while having a satisfactory output impedance.

Preferably, the transistors M1 and M2 are produced on and in a semiconductor substrate of a silicon-on-insulator (SOI) technology. SOI technology allows higher quality factors to be obtained in comparison with other technologies.

However, the transistors M1 and M2 may, depending on the need, be in a configuration other than the body contact and floating body configuration respectively, or be of another nature, for example bipolar or CMOS transistors, or produced in BiCMOS (bipolar and CMOS) technology supported on and in a semiconductor substrate.

The decoupling capacitor Cvdd allows potential variations on the supply Vdd to be removed and filtered to ground.

The inductive output element Lout in particular allows the output impedance to be matched to a required value. The assembly of the inductive output element Lout and of the output capacitor Cout allows the output matching desired at the working frequency to be obtained.

Figure 3:
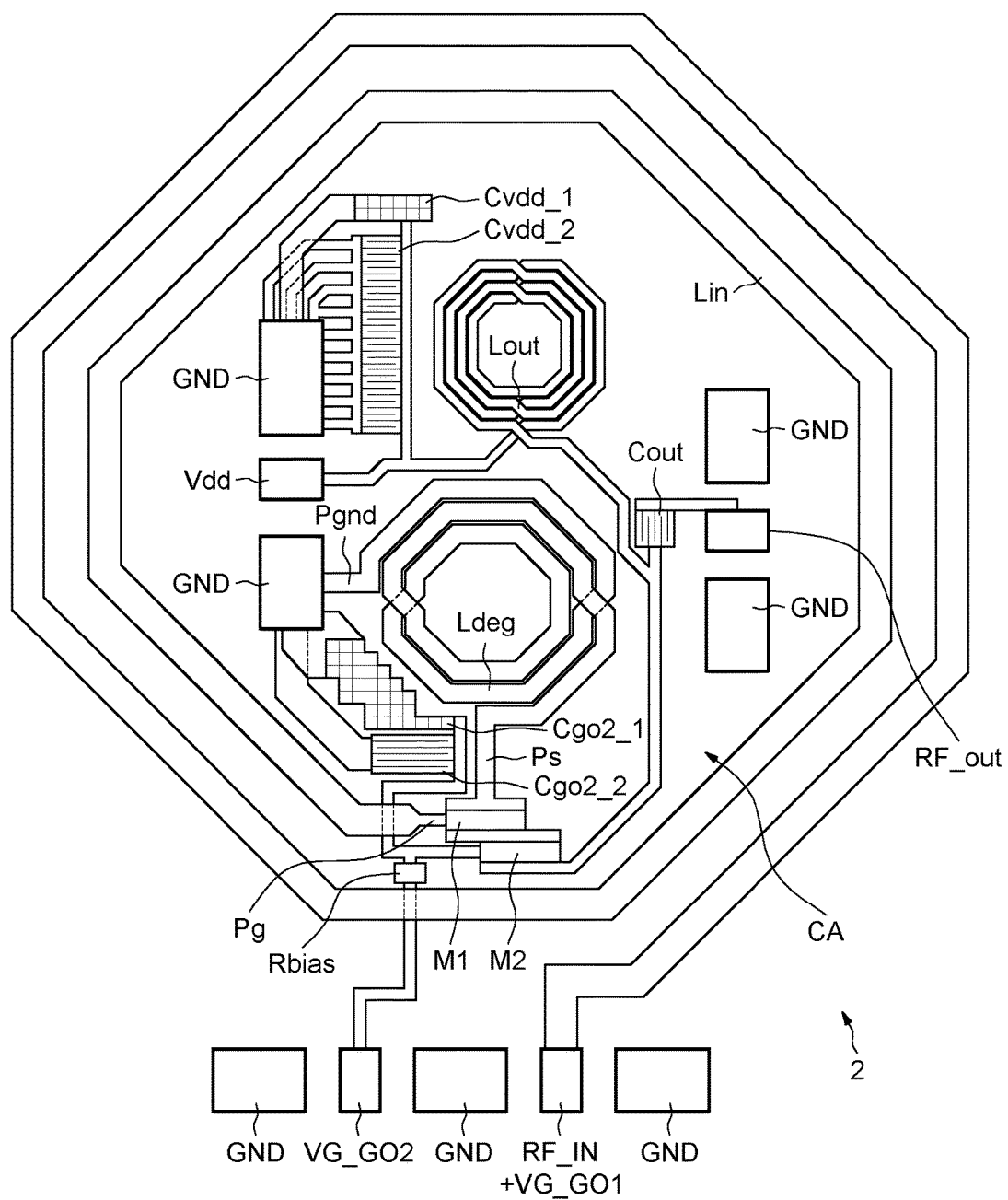
FIG. 3 shows an exemplary architecture of an amplifier device structure.

FIG. 3 shows an architecture of an, advantageously low noise, integrated amplifier device structure 2 corresponding to the circuit described above in relation to FIG. 2, in which the amplifier circuit CA and the inductive degeneration Ldeg and output Lout elements are positioned on the inside of a region delimited by the inductive input element Lin.

The integrated amplifier device 2 is produced, according to this architecture, on a single semiconductor substrate surmounted by a back end of line (BEOL) portion and conventionally comprises pads for making external connection to the supply Vdd, ground GND, input RF_IN+VG_GO1, output RF_OUT and bias voltage VG_GO2 terminals.

The various pads for connecting to the ground terminals GND shown in FIG. 3 are all linked to a ground plane that is not shown in this representation, corresponding to a uniform common ground.

Usually, the amplifier circuit CA is produced in and on the semiconductor substrate and the inductive elements in the metallization levels of the back end of line portion.

These connection pads are intended, for example, to receive metallization bumps in order to enable flip chip interconnection. These connection pads may also, for example, allow probes to be applied in order to characterize the circuit in terms of small signal performance, noise and linearity.

The inductive input element Lin is here formed by a metal track in the form of a non-intersecting flat spiral, i.e. the metal track winds around without unwinding, one end terminal of the inductive input element consequently being located on the outside of the spiral and the other end terminal located on the inside of the spiral.

Consequently, in this configuration that advantageously avoids the superposition of metal tracks of the inductive input element Lin, this being a source of parasitic components, the pad for connecting to the input terminal to receive the signal RF_IN+VG_GO2 is located on the outside of the spiral.

The pad for connecting to the bias voltage terminal for receiving the bias voltage VG_GO2 is, in this non-limiting representation, also located on the outside of the inductive input element Lin, but according to the general features, nothing prevents an embodiment comprising this pad located on the inside of the inductive input element Lin.

The transistor M1 is positioned very close to the inner end terminal of the inductive input element Lin in order to minimize the length of a connecting track Pg linking said inductive input element Lin to the gate of the transistor M1. In particular, this allows losses at the input of the amplifier circuit CA to be reduced.

The inductive degeneration element Ldeg is configured so as to be as compact as possible. Connecting tracks Ps and Pgnd at the end terminals of the inductive element Ldeg and the inductive element Ldeg are optimized together, so as to obtain the desired inductance "L" and a quality factor "Q" that is optimal at the working frequency.

In particular, this allows the surface area occupied on the inside of the inductive input element Lin to be decreased.

In this representation, in contrast to the inductive input element Lin, the inductive degeneration element Ldeg is formed by a flat spiral that intersects itself, i.e. in the form of a metal track that winds and unwinds, and the two end terminals of which are on the outside of the spiral.

The decoupling capacitors Cgo2 and Cvdd of FIG. 2 are shown here in a non-limiting manner in the respective combinations of capacitor pairs Cgo2_1 and Cgo2_2, Cvdd_1 and Cvdd_2. Each pair of capacitors comprises a capacitor (Cgo2_1, Cvdd_1) produced, for example, in MOM (metal-oxide-metal) technology comprising plates formed by intersecting metal "fingers" separated by oxide spaces, and a capacitor (Cgo2_2, Cvdd_2) produced, for example, in PIPCAP (poly-insulator-poly capacitor) technology by superposing layers of polysilicon, insulator and polysilicon.

These two capacitor technologies are well known to those skilled in the art and are used in combination in order to benefit from the advantages of each thereof. These advantages are based on linearity and density criteria, i.e. capacitance per $\mu m^2$.

The inductive output element Lout is positioned in a configuration such that, during normal operation of the amplifier device 2, the output current portion IRFout flowing through the inductive output element Lout flows in a direction of rotation that is opposite to the direction of rotation of the input current IRFin flowing through the inductive input element Lin.

Specifically, in the configuration shown in FIG. 3, the input current IRFin flows through the inductive input element Lin in an anticlockwise direction, from the input terminal RF_IN+VG_GO1 to the gate of the transistor M1. In this same configuration, the output current portion IRFout flows through the inductive output element Lout in a clockwise direction, from the drain of the transistor M2 to the supply terminal Vdd.

The magnetic fields generated by the two inductive input Lin and output Lout elements are consequently in opposite directions and the coupling of one to the other is very much reduced.

This configuration allows an improved isolation factor $S_{12}$ to be obtained, for example a reduction of substantially 6 dB with respect to a configuration in which the current flows in the same direction in said two inductive elements.

The other components of the amplifier circuit CA, described above in relation to FIG. 2, are advantageously positioned on the surface area available on the inside of the inductive input element Lin and the configuration shown in FIG. 3 is, geometrically speaking, in no way limiting.

The invention claimed is:

1. An integrated amplifier device, comprising:
   an inductive input winding having a coil which surrounds a region of an integrated circuit,
   an amplifier circuit formed located within said region,
   an inductive output winding located within said region,
   an inductive degeneration winding located within said region,
   a first external connection pad directly connected to a first terminal of the inductive output winding, said first external connection pad located within said region and configured to receive a supply voltage, and
   a second external connection pad directly connected to a first terminal of the inductive degeneration winding, said second external connection pad located within said region and configured to receive a ground voltage.

2. The device according to claim 1, wherein the amplifier circuit comprises at least one first transistor configured to operate in an amplification mode.

3. The device according to claim 2, wherein the amplifier circuit comprises a cascode assembly comprising the at least one first transistor and a second transistor.

4. The device according to claim 2, wherein the inductive input winding is coupled between a gate of the at least one first transistor and an input terminal, the gate of the at least one first transistor located adjacent a terminal of the inductive input winding.

5. The device according to claim 2, wherein said inductive degeneration winding is coupled between a source of the at least one first transistor and the second external connection pad, the source of the at least one first transistor being placed adjacent to a second terminal of said inductive degeneration winding and the second external connection pad being placed adjacent said first terminal of said inductive degeneration winding.

6. The device according to claim 1, further comprising:
   a capacitor having a first terminal connected to an output of the amplifier circuit and having a second terminal, said capacitor located within said region; and
   a third external connection pad directly connected to the second terminal, said third external connection pad located within said region.

7. The device according to claim 1, wherein coils of the inductive output winding and the inductive degeneration winding do not wind one around another.

8. An integrated amplifier device, comprising:
   a semiconductor substrate;
   a back end of line structure supported by said semiconductor substrate;
   an amplifier circuit formed in and on said semiconductor substrate;
   an inductive input winding, an inductive output winding and an inductive degeneration winding provided within said back end of line structure;
   wherein a region of the back end of line structure is surrounded by a coil of said inductive input winding and the inductive output winding and the inductive degeneration winding are located within said surrounded region;
   a first external connection pad directly connected to a terminal of the inductive output winding, said first external connection pad located within said surrounded region and configured to receive a supply voltage, and
   a second external connection pad directly connected to a terminal of the inductive degeneration winding, said second external connection pad located within said surrounded region and configured to receive a ground voltage.

9. The device of claim 8, wherein said back end of line structure includes metallization levels and the inductive input winding, inductive output winding and inductive degeneration winding are formed in one or more of the metallization levels.

10. The device of claim 8, further comprising:
    a capacitor having a first terminal connected to an output of the amplifier circuit and having a second terminal; and
    a third external connection pad directly connected to the second terminal, said third external connection pad located within said region.

11. The device according to claim 8, wherein coils of the inductive output winding and the inductive degeneration winding do not wind one around another.

12. An integrated amplifier device, comprising:
    an inductive input winding configured to coil around a region of an integrated circuit,
    an amplifier circuit formed located within said region,
    an inductive output winding located within said region,
    an inductive degeneration winding located within said region,
    a first external connection pad directly connected to a first terminal of the inductive output winding, said first external connection pad located within said region and configured to receive a supply voltage, and
    a second external connection pad directly connected to a first terminal of the inductive degeneration winding, said second external connection pad located within said region and configured to receive a ground voltage;
    wherein the inductive input winding is configured to permit an input current to flow between an input terminal and the amplifier circuit in a first direction, and the inductive output winding is configured to permit an output current to flow between the amplifier circuit and the first external connection pad in a second direction that is opposite to the first direction.

13. The device according to claim 12, wherein the amplifier circuit comprises at least one first transistor configured to operate in an amplification mode.

14. The device according to claim 13, wherein the amplifier circuit comprises a cascode assembly comprising the at least one first transistor and a second transistor.

15. The device according to claim 13, wherein the inductive input winding is coupled between a gate of the at least one first transistor and an input terminal, the gate of the at least one first transistor located adjacent a terminal of the inductive input winding.

16. The device according to claim 13, wherein said inductive degeneration winding is coupled between a source of the at least one first transistor and the second external connection pad, the source of the at least one first transistor being placed adjacent to a second terminal of said inductive degeneration winding and the second external connection pad being placed adjacent said first terminal of said inductive degeneration winding.

17. The device according to claim 12, further comprising:
    a capacitor having a first terminal connected to an output of the amplifier circuit and having a second terminal; and
    a third external connection pad directly connected to the second terminal, said third external connection pad located within said region.

18. An integrated amplifier device, comprising:
a semiconductor substrate;
a back end of line structure supported by said semiconductor substrate;
an amplifier circuit formed in and on said semiconductor substrate;
an inductive input winding, an inductive output winding and an inductive degeneration winding provided within said back end of line structure;
wherein said inductive input winding coils around a region of the back end of line structure and the inductive output winding and the inductive degeneration winding are located within said region;
a first external connection pad directly connected to a terminal of the inductive output winding, said first external connection pad located within said region and configured to receive a supply voltage, and
a second external connection pad directly connected to a terminal of the inductive degeneration winding, said second external connection pad located within said region and configured to receive a ground voltage;
wherein the inductive input winding is configured to permit an input current to flow between an input terminal and the amplifier circuit in a first direction, and the inductive output winding is configured to permit an output current to flow between the amplifier circuit and the first external connection pad in a second direction that is opposite to the first direction.

19. The device of claim 18, wherein said back end of line structure includes metallization levels and the inductive input winding, inductive output winding and inductive degeneration winding are formed in one or more of the metallization levels.

20. The device of claim 18, further comprising:
a capacitor having a first terminal connected to an output of the amplifier circuit and having a second terminal; and
a third external connection pad directly connected to the second terminal, said third external connection pad located within said region.

* * * * *